United States Patent
Kim et al.

(10) Patent No.: US 9,349,457 B2
(45) Date of Patent: May 24, 2016

(54) HIGH VOLTAGE SWITCH, NONVOLATILE MEMORY DEVICE COMPRISING SAME, AND RELATED METHOD OF OPERATION

(71) Applicant: SAMSUNG ELECTRONICS CO., LTD., Suwon-Si, Gyeonggi-Do (KR)

(72) Inventors: Taehyun Kim, Seongnam-Si (KR); Youngsun Min, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/455,344

(22) Filed: Aug. 8, 2014

(65) Prior Publication Data

US 2015/0138893 A1  May 21, 2015

(30) Foreign Application Priority Data

Nov. 21, 2013  (KR) ........................ 10-2013-0142284

(51) Int. Cl.
  *G11C 16/08*  (2006.01)
  *H03K 17/16*  (2006.01)
  *G11C 16/12*  (2006.01)
  *G11C 16/34*  (2006.01)

(52) U.S. Cl.
  CPC ................ *G11C 16/08* (2013.01); *G11C 16/12* (2013.01); *G11C 16/3418* (2013.01); *H03K 17/165* (2013.01)

(58) Field of Classification Search
  CPC .................................................. G11C 16/08
  USPC ....................................... 365/185.18, 185.23
  See application file for complete search history.

(56) References Cited

U.S. PATENT DOCUMENTS

| | | | |
|---|---|---|---|
| 4,893,275 A | 1/1990 | Tanaka et al. | |
| 4,989,127 A | 1/1991 | Wegener | |
| 5,315,188 A | 5/1994 | Lee | |
| 6,411,554 B1 | 6/2002 | Kawai | |
| 7,206,228 B2 | 4/2007 | Park | |
| 7,233,193 B2 | 6/2007 | Kim | |
| 7,515,503 B2 | 4/2009 | Lee et al. | |
| 7,609,554 B2 | 10/2009 | Tanzawa | |
| 7,630,242 B2 * | 12/2009 | Taito et al. | 365/185.11 |
| 7,826,297 B2 | 11/2010 | Takeda et al. | |
| 8,390,342 B2 | 3/2013 | Jang | |
| 8,446,784 B2 | 5/2013 | Tanzawa | |
| 2007/0053227 A1 * | 3/2007 | Ragone et al. | 365/189.09 |
| 2007/0133300 A1 * | 6/2007 | Tanzawa | 365/185.23 |
| 2011/0156796 A1 * | 6/2011 | Jang | 327/436 |
| 2011/0273940 A1 * | 11/2011 | Tanzawa | 365/189.11 |
| 2012/0081172 A1 * | 4/2012 | Huynh et al. | 327/437 |
| 2012/0163087 A1 | 6/2012 | Hung et al. | |
| 2012/0320684 A1 * | 12/2012 | Macerola | 365/185.25 |
| 2013/0162326 A1 | 6/2013 | Sutandi et al. | |

* cited by examiner

*Primary Examiner* — Hoai V Ho
*Assistant Examiner* — Muna A Techane
(74) *Attorney, Agent, or Firm* — Volentine & Whitt, PLLC (57) ABSTRACT

A high voltage switch operates in response to a first drive voltage and a second drive voltage higher than the first drive voltage. The high voltage switch includes a PMOS transistor transmitting the second drive voltage to an output terminal according to a voltage applied to its gate, a first depletion mode transistor providing the second drive voltage to the PMOS transistor according to an output signal fed back from the output terminal, a second depletion mode transistor receiving the second drive voltage through one end and providing a switching voltage to another end according to a switching control signal, and a level shifter providing the switching voltage to a gate of the PMOS transistor according to an enable signal and a reverse enable signal.

20 Claims, 10 Drawing Sheets

HIGH VOLTAGE SWITCH, NONVOLATILE MEMORY DEVICE COMPRISING SAME, AND RELATED METHOD OF OPERATION

CROSS-REFERENCE TO RELATED APPLICATIONS

This application claims priority under 35 U.S.C. §119 to Korean Patent Application No. 10-2013-0142284 filed on Nov. 21, 2013, the subject matter of which is hereby incorporated by reference.

BACKGROUND OF THE INVENTION

The inventive concept relates generally to electronic memory technologies, and more particularly to a high voltage switch and a nonvolatile memory device comprising the same.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include dynamic random access memory (DRAM) and static random access memory (SRAM), and examples of nonvolatile memory devices include read only memory (ROM), magnetoresistive random access memory (MRAM), resistive random access memory (RRAM), and flash memory. Flash memory is an especially popular form of nonvolatile memory due to attractive features such as relatively high storage density, efficient performance, low cost per bit, and an ability to withstand physical shock.

A flash memory device typically requires a program and/or erase voltage that is higher than a power supply voltage VDD provided from an external source. The erase voltage is, for instance, 20V. To provide these or other high voltages, a high voltage Vpp is provided to a high voltage switch, which in turn provides a related high voltage to a memory cell array.

The high voltage switch operates according to a feedback structure of a depletion mode transistor and a positive metal oxide semiconductor (PMOS) transistor. The depletion mode transistor and PMOS transistor may have slightly different threshold voltages depending on process technology used to manufacture them. Where a threshold voltage of a depletion mode transistor is lower than an average value, an initial feedback loop start time of the high voltage switch is late. Where a threshold voltage of a depletion mode transistor is higher than an average value, a leakage current may occur in a PMOS transistor.

While the high voltage switch is turned on, a high voltage (e.g., 20V) continues to be maintained between a gate and a drain of a PMOS transistor. Thus, deterioration due to Fowler-Nordheim (FN) stress may occur in the PMOS transistor.

SUMMARY OF THE INVENTION

In one embodiment of the inventive concept, a high voltage switch operates in response to a first drive voltage and a second drive voltage higher than the first drive voltage. The high voltage switch comprises a PMOS transistor transmitting the second drive voltage to an output terminal according to a voltage applied to its gate, a first depletion mode transistor providing the second drive voltage to the PMOS transistor according to an output signal fed back from the output terminal, a second depletion mode transistor receiving the second drive voltage through one end and providing a switching voltage to another end according to a switching control signal, and a level shifter providing the switching voltage to a gate of the PMOS transistor according to an enable signal and a reverse enable signal. The enable signal and the reverse enable signal have a ground voltage or a level of the first drive voltage according to an input signal and a control signal.

In another embodiment of the inventive concept, a nonvolatile memory device comprises a memory cell array comprising memory cells connected to a word line and a bit line, a pass transistor transmitting a first high voltage to the word line, and a high voltage switch boosting a level of an input signal to a level of a second high voltage to provide the boosted input signal to a gate of the pass transistor.

In yet another embodiment of the inventive concept, a method is provided for operating a non-volatile memory device comprising a high voltage switch that controls application of a high voltage signal to a memory array in response to a first drive signal and a second drive signal having a higher voltage level than the first drive signal. The method comprises operating a positive metal oxide semiconductor (PMOS) transistor to transmit the second drive voltage to an output terminal according to a voltage applied to its gate, operating a first depletion mode transistor to provide the second drive voltage to the PMOS transistor according to an output signal fed back from the output terminal, operating a second depletion mode transistor to receive the second drive voltage through one end and to provide a switching voltage to another end according to a switching control signal, and operating a level shifter to provide the switching voltage to a gate of the PMOS transistor according to an enable signal and a reverse enable signal. The enable signal and the reverse enable signal have a ground voltage or a level of the first drive voltage according to an input signal and a control signal.

These and other embodiments of the inventive concept may use a high voltage switch to cut off a leakage current in a block in which an operation is not performed, which can improve the lifetime of a nonvolatile memory device by preventing deterioration of a PMOS transistor in the high voltage switch.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

Figure 1:
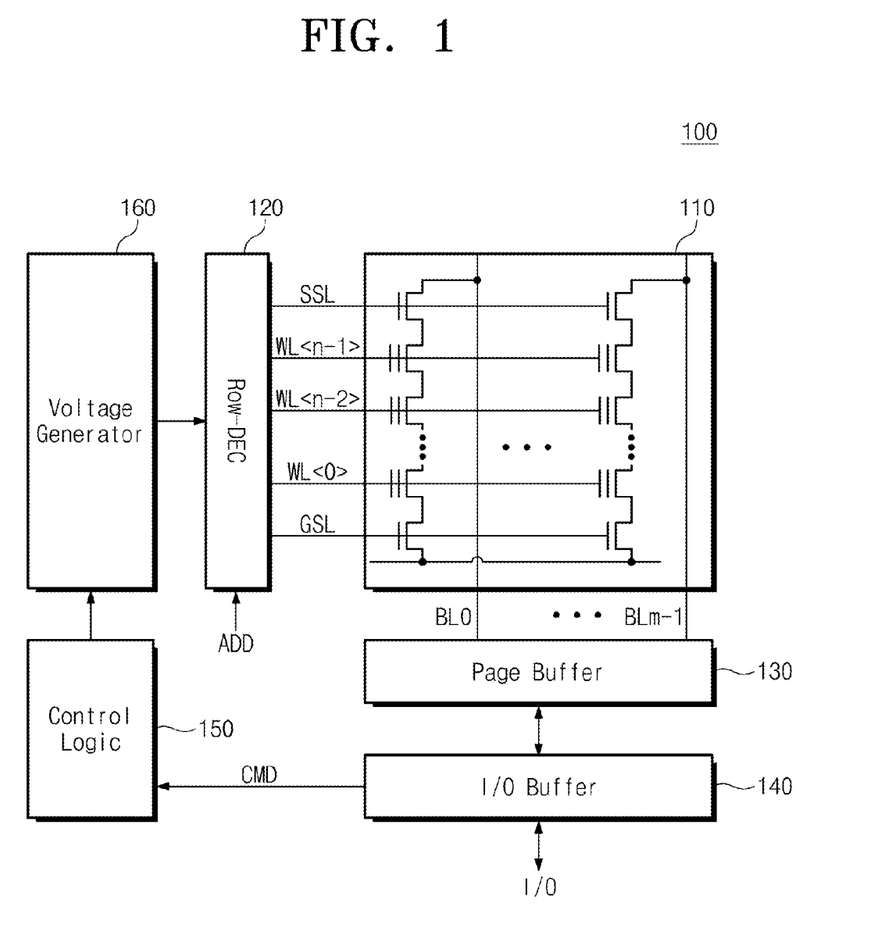
FIG. 1 is a block diagram illustrating a nonvolatile memory device according to an embodiment of the inventive concept.

FIG. 1 is a block diagram illustrating a nonvolatile memory device according to an embodiment of the inventive concept.

Referring to FIG. 1, a nonvolatile memory device 100 comprises a cell array 110, a row decoder 120, a page buffer 130, an input/output buffer 140, control logic 150, and a voltage generator 160.

Cell array 110 is connected to row decoder 120 through word lines WL<0>~WL<n−1> and selection lines SSL and GSL. It is also connected to page buffer 130 through bit lines BL0~BLm−1. Cell array 110 comprises multiple NAND type cell strings each forming a channel along a horizontal or vertical direction. Memory cells in each cell string is programmed or erased by a high voltage provided from row decoder 120.

Row decoder 120 selects one of memory blocks of cell array 110 in response to a row address ADD, and it further selects one of word lines WL<0>~WL<n−1> of the selected memory block. Row decoder 120 transmits a high voltage provided from voltage generator 160 to word lines or selection lines SSL and GSL of the selected memory block. To transmit a high voltage to the selected memory block, row decoder 120 comprises a pass transistor, which is a high voltage transistor. The pass transistor provides switching for a high voltage, and is turned on or turned off by a high voltage. To switch the pass transistor, a high voltage switch for boosting a control signal of a low voltage to a high voltage is required.

The high voltage switch can change a control signal with a relatively low voltage level into a high voltage Vpp provided from an external source. The pass transistor can be controlled to output a relatively low voltage level by the high voltage switch. The high voltage switch can control a gate voltage of the pass transistor through a feedback structure using a depletion mode transistor and a PMOS transistor. Where the high voltage switch is turned off, it can control a gate voltage of the PMOS transistor to cut off a leakage current flowing through the PMOS transistor. After high voltage Vpp is applied to a gate of the pass transistor, the high voltage switch can increase a gate voltage of the PMOS transistor to a predetermined voltage. While high voltage Vpp is provided to the pass transistor, a voltage difference between a gate and a source of the PMOS transistor is reduced. Thus, deterioration of the PMOS transistor can be prevented.

Page buffer 130 can operate as a write driver or a sense amplifier according to an operation mode. In a program operation, buffer page 130 transmits a voltage corresponding to data to be programmed to a bit line of cell array 110. In a read operation, page buffer 130 senses data stored in the selected memory cell through a bit line to transmit the sensed data to input/output buffer 140.

Input/output buffer 140 transmits data input to page buffer 130 or outputs data provided from page buffer 130. Input/output buffer 140 can transmit an address ADD or a command CMD being input to control logic 150 or row decoder 120.

Control logic 150 controls program, read and erase operations in response to a command CMD being transmitted from input/output buffer 140. In a read operation, control logic 150 controls voltage generator 160 so that a selection read voltage Vrd, a non-selection read voltage Vread and selection line voltages $V_{SSL}$ and $V_{GSL}$ are generated. Control logic 150 controls page buffer 130 to sense data through a bit line.

Voltage generator 160 generates various types of word line voltages to be provided to word lines WL<0>~WL<n−1> and a voltage to be provided to a bulk (e.g., a well region) in which memory cells are formed under the control of control logic 150. Examples of the word line voltages to be provided to word lines WL<0>~WL<n−1> include a program voltage Vpgm, a pass voltage Vpass and selection, and non-selection read voltages Vrd and Vread. In read and program operations, voltage generator 160 generates selection line voltages $V_{SSL}$ and $V_{GSL}$ to be provided to selection lines SSL and GSL. Voltage generator 160 provides an erase voltage Vers of the high voltage to a bulk of the memory block selected when an erase operation is performed.

Voltage generator 160 uses high voltage Vpp to generate a high voltage for a program or erase operation. When using high voltage Vpp provided from an external source, a boosting speed and efficiency can be improved.

As indicated by the foregoing, nonvolatile memory device 100 comprises a high voltage switch and can cut off a leakage current in a block in which an operation is not performed. This may improve the lifetime of nonvolatile memory device 100 by preventing deterioration of a PMOS transistor in the high voltage switch.

Figure 2:
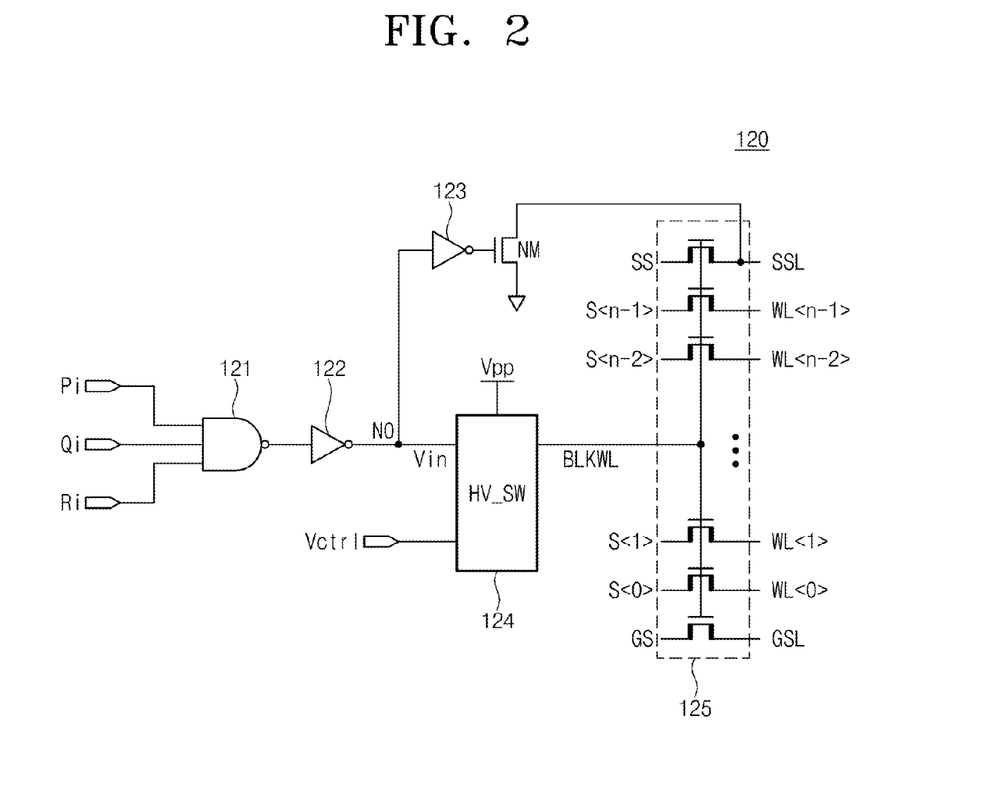
FIG. 2 is a circuit diagram illustrating a structure of a row decoder according to an embodiment of the inventive concept.

FIG. 2 is a circuit diagram illustrating a structure of a row decoder according to an embodiment of the inventive concept.

Referring to FIG. 2, row decoder 120 comprises a NAND gate 121, inverters 122 and 123, a high voltage switch 124 and a pass transistor 125.

NAND gate 121 and inverter 122 constitute a block decoder. NAND gate 121 performs a NAND logical operation with respect to decoding signals Pi, Qi, and Ri provided by a row address. An output of NAND gate 121 is inverted by inverter 122. A structure for cutting off an output of NAND gate 121 is further included depending on whether or not the block decoder is a bad block. An output of inverter 122 is a block selection signal of a low voltage and is transmitted to a node NO.

Where decoding signals Pi, Qi, and Ri are all activated, node NO is set to a high level. A switch NM for making string selection line SSL disabled is cut off. High voltage switch 124 outputs a logical value of node NO as a block selection signal boosted to a high voltage. The block selection signal changed to a high voltage level is transmitted to a block word line BLKWL. Pass transistor 125 is switched by the block selection signal of a high voltage transmitted to block word line BLKWL.

Pass transistor 125 transmits voltages SS, S<0>~S<n−1>, GS generated from voltage generator 160 (See, e.g., FIG. 1) to word lines WL<0>~WL<n−1> or selection lines SSL and GSL. A word line voltage transmitted by pass transistor 125 is a high voltage relatively higher than a voltage driving a general circuit. Thus, pass transistor 125 can be constituted by a high voltage transistor being driven in a high voltage. A channel of the high voltage transistor is formed to be longer than a channel of a low voltage transistor to endure a high voltage, i.e., to prevent punch through between a source and a drain. A gate oxide layer of the high voltage transistor is formed thicker than a gate oxide layer of a low voltage transistor to endure a high voltage, that is, to endure a high electric potential difference between a gate and a drain/source. Accordingly, the high voltage transistor has a wider chip area greater than a low voltage transistor.

High voltage switch 124 is provided with a high voltage Vpp input from an external source to change a block selection signal of a low voltage being transmitted to node NO into a high voltage level. High voltage switch 124 uses a structure of a depletion mode transistor and a PMOS transistor to change a block selection signal of a low voltage into a high voltage level. High voltage switch 124 controls a gate voltage of the PMOS transistor to cut off a leakage current flowing through the PMOS transistor. While high voltage Vpp is supplied to pass transistor 125, high voltage switch 124 can control a gate voltage of the PMOS transistor to prevent deterioration of the PMOS transistor.

Figure 3:
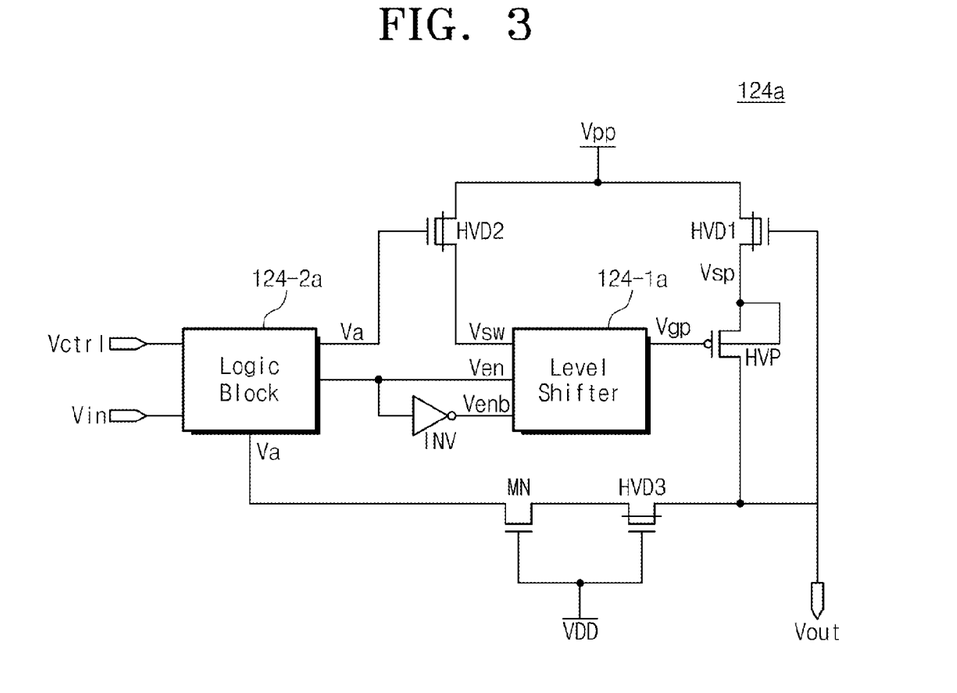
FIG. 3 is a circuit diagram illustrating a high voltage switch of FIG. 2 according to an embodiment of the inventive concept.

FIG. 3 is a circuit diagram illustrating a high voltage switch of FIG. 2 according to an embodiment of the inventive concept.

Referring to FIG. 3, a high voltage switch 124a comprises a level shifter 124-1a, a logic block 124-2a, an inverter INV, depletion mode transistors HVD1, HDV2 and HDV3, a PMOS transistor HVP and an NMOS transistor MN. A first drive voltage VDD provided from an external source is provided as a power supply voltage of logic block 124-2a and inverter INV. Thus, an output voltage level of logic block 124-2a and inverter INV is provided as a ground voltage GND or a first drive voltage VDD. A second drive voltage Vpp of a high voltage is applied to drains of the first and second depletion mode transistors HVD1 and HDV2.

Logic block 124-2a receives an input signal Vin and a control signal Vctrl. Logic block 124-2a is constituted by a logic circuit. Logic block 124-2a can generate a switching control signal Va and an enable signal Ven according to input signal Vin and control signal Vctrl. Switching control signal Va is provided to a gate of first depletion mode transistor HVD1 and a source of NMOS transistor MN. Second depletion mode transistor HVD2 provides a switching voltage Vsw to level shifter 124-1a according to switching control signal Va. Where input signal Vin has a high level, high voltage switch 124a is turned on, and where input signal Vin has a low level, high voltage switch 124a is turned off.

Level shifter 124-1a receives enable signal Ven, a reverse enable signal Venb, and switching voltage Vsw. Reverse enable signal Venb is provided by reversing enable signal Ven. Level shifter 124-1a generates a PMOS gate voltage Vgp provided to a gate of PMOS transistor HVP in response to enable signal Ven, reverse enable signal Venb and switching voltage Vsw. Switching voltage Vsw is a threshold voltage Vth of second depletion mode transistor HVD2 or a sum (VDD+Vth) of threshold voltage Vth of first depletion mode transistor HVD2 and first drive voltage VDD by level shifter 124-1a. Second depletion mode transistor HVD2 and first depletion mode transistor HVD1 may be manufactured with the same specification to have the same threshold voltage.

Where high voltage switch 124a is turned off, level shifter 124-1a provides a threshold voltage Vth of second depletion mode transistor HVD2 to a gate of the PMOS transistor HVP. Where high voltage switch 124a is turned off, an output signal Vout has ground voltage GND. Where output signal Vout is ground voltage GND, a PMOS source voltage Vsp applied to a source of PMOS transistor HVP is a threshold voltage Vth of first depletion mode transistor HVD1. Thus, because there is no voltage difference between a gate and a source of PMOS transistor HVP, a leakage current flowing through PMOS transistor HVP can be cut off.

Where high voltage switch 124a is turned on, high voltage switch 124a outputs a second drive voltage Vpp. After output signal Vout increases to second drive voltage Vpp, a gate voltage of PMOS transistor HVP does not need to be maintained at ground voltage GND. Thus, where a designated time passes after high voltage switch 124a is turned on, high voltage switch 124a increases a gate voltage of PMOS transistor HVP to prevent deterioration of PMOS transistor HVP. Where the designated time passes after high voltage switch 124a is turned on, high voltage switch 124a increases a gate voltage of PMOS transistor HVP to a sum (VDD+Vth) of threshold voltage Vth of second depletion mode transistor HVD1 and first drive voltage VDD to prevent deterioration of PMOS transistor HVP.

First depletion mode transistor HVD1 and PMOS transistor HVP constitute a feedback structure to provide an output signal Vout. For example, where a block of nonvolatile memory device 100 (See, e.g., FIG. 1) is selected to perform a program, read or erase operation, high voltage switch 124a can transmit second drive voltage Vpp provided from an external source to pass transistor 125 (See, e.g., FIG. 2). Second drive voltage Vpp is provided to a drain of first depletion mode transistor HVD1. Where a block of nonvolatile memory device 100 is selected, PMOS gate voltage Vgp is ground voltage GND by level shifter 124-1a. Thus, PMOS transistor HVP is turned on.

At first, because output signal Vout is ground voltage GND, a gate voltage of first depletion mode transistor HVD1 is ground voltage GND. PMOS source voltage Vsp can be increased to a threshold voltage Vth of first depletion mode transistor HVD1. Thus, output signal Vout becomes threshold voltage Vth of first depletion mode transistor HVD1. Output signal Vout is fed back to a gate of first depletion mode transistor HVD1. PMOS source voltage Vsp is increased to a sum (VDD+Vth) of output signal Vout and a threshold voltage Vth of first depletion mode transistor HVD1. When repeating those processes, output signal Vout can be increased to second drive voltage Vpp. Consequently, second drive voltage Vpp is provided to pass transistor 125.

High voltage switch 124a can operate in any of three modes, including an off mode, an on mode, and a relaxation mode.

In the off mode, high voltage switch 124a can prevent a leakage current of PMOS transistor HVP using second depletion mode transistor HVD2. For example, in the off mode, input signal Vin and control signal Vctrl may have a low level. Logic block 124-2a can output a switching control signal Va having the same level as input signal Vin. Logic block 124-2a outputs an enable signal Ven of a high level. Second depletion mode transistor HVD2 transmits switching voltage Vsw to level shifter 124-1a according to switching control signal Va inputted in its gate. Because switching control signal Va has a low level, switching voltage Vsw becomes a threshold voltage Vth of second depletion mode transistor HVD2. At this time, level shifter 124-1a can output PMOS gate voltage Vgp having the same level as switching voltage Vsw. PMOS gate voltage Vgp can be input to a gate of PMOS transistor HVP. Because output signal Vout is ground voltage GND, a gate voltage of first depletion mode transistor HVD1 is ground voltage GND. PMOS source voltage Vsp is set to a threshold voltage Vth of first depletion mode transistor HVD1. Thus, a voltage difference between a gate and a source of PMOS transistor HVP becomes 0V. A leakage current flowing through PMOS transistor HVP is cut off.

In the on mode, high voltage switch 124a can increase output signal Vout to second drive voltage Vpp. For example, in the on mode, input signal Vin may have a high level and control signal Vctrl may have a low level. Logic block 124-2a can output a control signal Va with the same level as input signal Vin. Logic block 124-2a can output an enable signal Ven of a low level. At this time, level shifter 124-1a can output PMOS gate voltage Vgp which is ground voltage GND according to enable signal Ven and reverse enable signal Venb. PMOS gate voltage Vgp is provided to a gate of PMOS transistor HVP. Where PMOS gate voltage Vgp is ground voltage GND, PMOS transistor HVP is turned on. Thus, output signal Vout can be increased to second drive voltage Vpp by a feedback structure of first depletion mode transistor HVD1 and PMOS transistor HVP.

In the relaxation mode, high voltage switch 124a can prevent deterioration of PMOS transistor HVP using second depletion mode transistor HVD2. For example, in the relaxation mode, input signal Vin and control signal Vctrl may have a high level. Logic block 124-2a can output switching control signal Va having the same level as input signal Vin. Logic block 124-2a can output an enable signal of a high level. Switching voltage Vsw is provided to level shifter 124-1a according to switching control signal Va which is input in a gate of second depletion mode transistor HVD2. Where switching control signal Va has a high level, switching voltage Vsw is a sum of switching control signal Va and a threshold voltage Vth of second depletion mode transistor HVD2. That is, switching voltage Vsw is a sum (VDD+Vth) of first drive voltage VDD and a threshold voltage Vth of second depletion mode transistor HVD2. At this time, level shifter 124-1a can output PMOS gate voltage Vgp having the same level as switching voltage Vsw. PMOS gate voltage Vgp is input in a gate of PMOS transistor HVP. Output signal Vout increased to second drive voltage Vpp after the on mode. Thus, a gate voltage of PMOS transistor HVP does not need to be maintained at ground voltage GND. During the relaxation mode, PMOS gate voltage Vgp is set to a sum (VDD+Vth) of first drive voltage VDD and a threshold voltage Vth of first depletion mode transistor HVD1. A voltage difference between a gate and a source of PMOS transistor HVP can be maintained at value smaller than second drive voltage Vpp. Thus, high voltage switch 124a can prevent deterioration of PMOS transistor HVP.

Where the mode is changed from the relaxation mode to the off mode, NMOS transistor MN and third depletion mode transistor HVD3 can lower output signal Vout to ground voltage GND. In the on mode and the relaxation mode, output signal Vout is second drive voltage Vpp. After that, the mode becomes the off mode, output signal Vout can be lowered to ground voltage GND by NMOS transistor MN and third depletion mode transistor HVD3. At this time, input signal Vin and control signal Vctrl is generated with a low level. Thus, PMOS transistor HVP is turned off. First drive voltage VDD is provided to gates of NMOS transistor MN and third depletion mode transistor HVD3. Logic block 124-2a provides switching control signal Va having the same level as input signal Vin. Because input signal Vin has a low level, output signal Vout is lowered to ground voltage GND.

Figure 4:
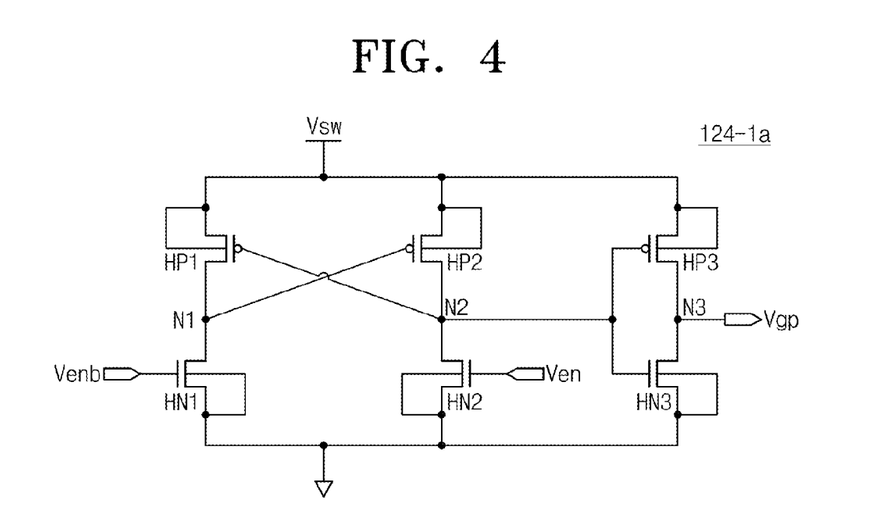
FIG. 4 is a circuit diagram illustrating a level shifter of FIG. 3 according to an embodiment of the inventive concept.

FIG. 4 is a circuit diagram illustrating a level shifter of FIG. 3 according to an embodiment of the inventive concept.

Referring to FIGS. 3 and 4, level shifter 124-1a comprises PMOS transistors HP1, HP2, and HP3 and NMOS transistors HN1, HN2 and HN3. Switching voltage Vsw is provided to sources of PMOS transistors HP1, HP2, and HP3. Ground voltage GND is provided to sources of NMOS transistors HN1, HN2 and HN3. However, the structure illustrated in FIG. 4 is only one example, and level shifter 124-1a can be embodied in other forms.

In the off mode, input signal Vin and control signal Vctrl have a low level. Logic block 124-2a provides switching control signal Va having the same level as input signal Vin to a gate of second depletion mode transistor HVD2. Switching control signal Va has the same low level as input signal Vin. Thus, switching voltage Vsw is provided as a threshold voltage of second depletion mode transistor HVD2. Logic block 124-2a provides an enable signal Ven of a high level according to input signal Vin and control signal Vctrl. Reverse enable signal Venb is provided by reversing enable signal Ven through inverter INV. Where enable signal Ven has a high level, NMOS transistor HN2 is turned on. Where NMOS transistor HN2 is turned on, a voltage of a node N2 becomes ground voltage GND. Where a voltage of a node N2 becomes ground voltage GND, PMOS transistor HP3 is turned on. Where PMOS transistor HP3 is turned on, switching voltage Vsw is provided as PMOS gate voltage Vgp. PMOS gate voltage Vgp is provided as a threshold voltage Vth of second depletion mode transistor HVD2. Thus, a threshold voltage Vth of second depletion mode transistor HVD2 is provided to a gate of PMOS transistor HVP. A gate voltage and a source voltage of PMOS transistor HVP become the same and thereby a leakage current flowing through PMOS transistor HVP is cut off.

In the on mode, input signal Vin is input with a high level, and control signal Vctrl is input with a low level. Logic block 124-2a provides switching control signal Va with the same level as input signal Vin to a gate of second depletion mode transistor HDV2. Switching control signal Va is provided with the same high level as input signal Vin. A voltage of switching control signal Va has first drive voltage VDD. Thus, switching voltage Vsw is provided as a sum (VDD+Vth) of first drive voltage VDD and a threshold voltage Vth of second depletion mode transistor HDV2.

Enable signal Ven is generated with a low level by logic block 124-2a. Reverse enable signal Venb is generated with a high level by inverter INV. Where reverse enable signal Venb has a high level, NMOS transistor HN1 is turned on. Where NMOS transistor HN1 is turned on, a voltage of a node N1 becomes ground voltage GND. Where the voltage of node N1 is ground voltage GND, PMOS transistor HP2 is turned on. Where PMOS transistor HP2 is turned on, a voltage of a node N2 becomes switching voltage Vsw. Where the voltage of node N2 becomes switching voltage Vsw, NMOS transistor HN3 is turned on. Where NMOS transistor HN3 is turned on, PMOS gate voltage Vgp is provided as ground voltage GND. Where PMOS gate voltage Vgp is ground voltage GND, PMOS transistor HVP of FIG. 3 is turned on. Thus, output signal Vout is increased to second drive voltage Vpp by first depletion mode transistor HVD1 and PMOS transistor HVP.

In the relaxation mode, input signal Vin and control signal Vctrl have a high level. Logic block 124-2a provides switching control signal Va having the same level as input signal Vin to a gate of second depletion mode transistor HVD2. Switching control signal Va has the same high level as input signal Vin. That is, a voltage of switching control signal Va has first drive voltage VDD. Thus, switching voltage Vsw is a sum (VDD+Vth) of first drive voltage VDD and a threshold voltage Vth of second depletion mode transistor HDV2. Logic block 124-2a provides an enable signal Ven of a high level according to input signal Vin and control signal Vctrl. Reverse enable signal Venb can be provided by reversing enable signal Ven through inverter INV. Where enable signal Ven has a high level, NMOS transistor HN2 is turned on. Where NMOS transistor HN2 is turned on, a voltage of node N2 becomes ground voltage GND. Where the voltage of node N2 becomes ground voltage GND, PMOS transistor HP3 is turned on. Where PMOS transistor HP3 is turned on, PMOS gate voltage Vgp is provided as switching voltage Vsw. That is, PMOS gate voltage Vgp is a sum (VDD+Vth) of first drive voltage VDD and a threshold voltage Vth of second depletion mode transistor HVD2. A source of PMOS transistor HVP of FIG. 3 is set to first drive voltage Vpp. A voltage difference between a gate and a source of PMOS transistor HVP is reduced by level shifter 124-1a. Thus, deterioration of PMOS transistor HVP can be prevented.

Figure 5:
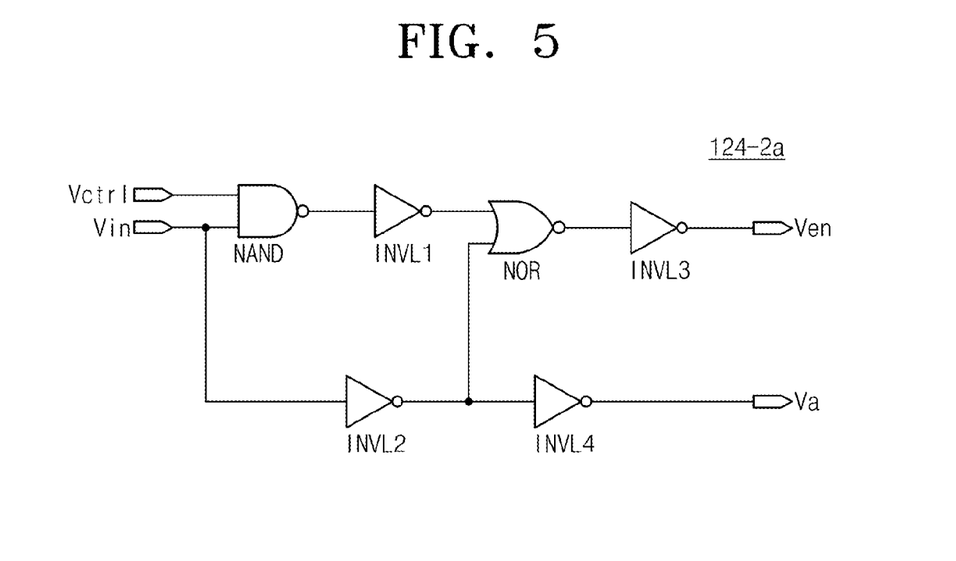
FIG. 5 is a circuit diagram illustrating a logic block of FIG. 3 according to an embodiment of the inventive concept.

FIG. 5 is a circuit diagram illustrating a logic block of FIG. 3 according to an embodiment of the inventive concept.

Referring to FIG. 5, logic block 124-2a comprises a NAND gate (NAND), a NOR gate (NOR) and inverters (INVL1, INVL2, INVL3 and INVL4). However, the structure illustrated in FIG. 5 is only one illustration and logic block 124-2a can be embodied in other forms. First drive voltage VDD being provide from an external source is provided as a power supply voltage of the NAND gate (NAND), the NOR gate (NOR) and the inverters (INVL1, INVL2, INVL3 and INVL4). Thus, levels of output voltages of the NAND gate (NAND), the NOR gate (NOR) and the inverters (INVL1, INVL2, INVL3 and INVL4) is first drive voltage VDD or ground voltage GND.

In the off mode, input signal Vin and control signal Vctrl are input with a low level. Switching control signal Va is generated with the same level as input signal Vin by inverters INVL2 and INVL4. That is, switching control signal Va is generated with a low level. An output of the NAND gate is generated with a low level. An output of inverter INVL1 is generated with a high level. Because high levels are input to input stages of the NOR gate, an output of the NOR gate is generated with a low level. Thus, enable signal Ven is generated with a high level by inverter INVL3.

In the on mode, input signal Vin is generated with a high level. Control signal Vctrl is input with a low level. Switching control signal Va is generated with the same level as input signal Vin by inverters INVL2 and INVL4. That is, switching control signal Va is generated with a high level. An output of the NAND gate is generated with a high level. An output of inverter INVL1 is generated with a low level. Because low levels are input to input stages of the NOR gate, an output of the NOR gate is generated with a high level. Thus, enable signal Ven is generated with a low level by inverter INVL3.

In the relaxation mode, input signal Vin is generated with a high level. Switching control signal Va is generated with the same level as input signal Vin by inverters INVL2 and INVL4. That is, switching control signal Va is generated with a high level. An output of the NAND gate is generated with a low level. An output of inverter INVL1 is generated with a high level. Because a high level and a low level are input to input stages of the NOR gate, an output of the NOR gate is generated with a low level. Thus, enable signal Ven is generated with a high level by inverter INVL3.

The enable signal generated by logic block 24-2a is provided to level shifter 124-1a. Switching control signal Va generated by logic block 124-2a is provided to first depletion mode transistor HVD1 (See, e.g., FIG. 3) and NMOS transistor MN.

Figure 6:
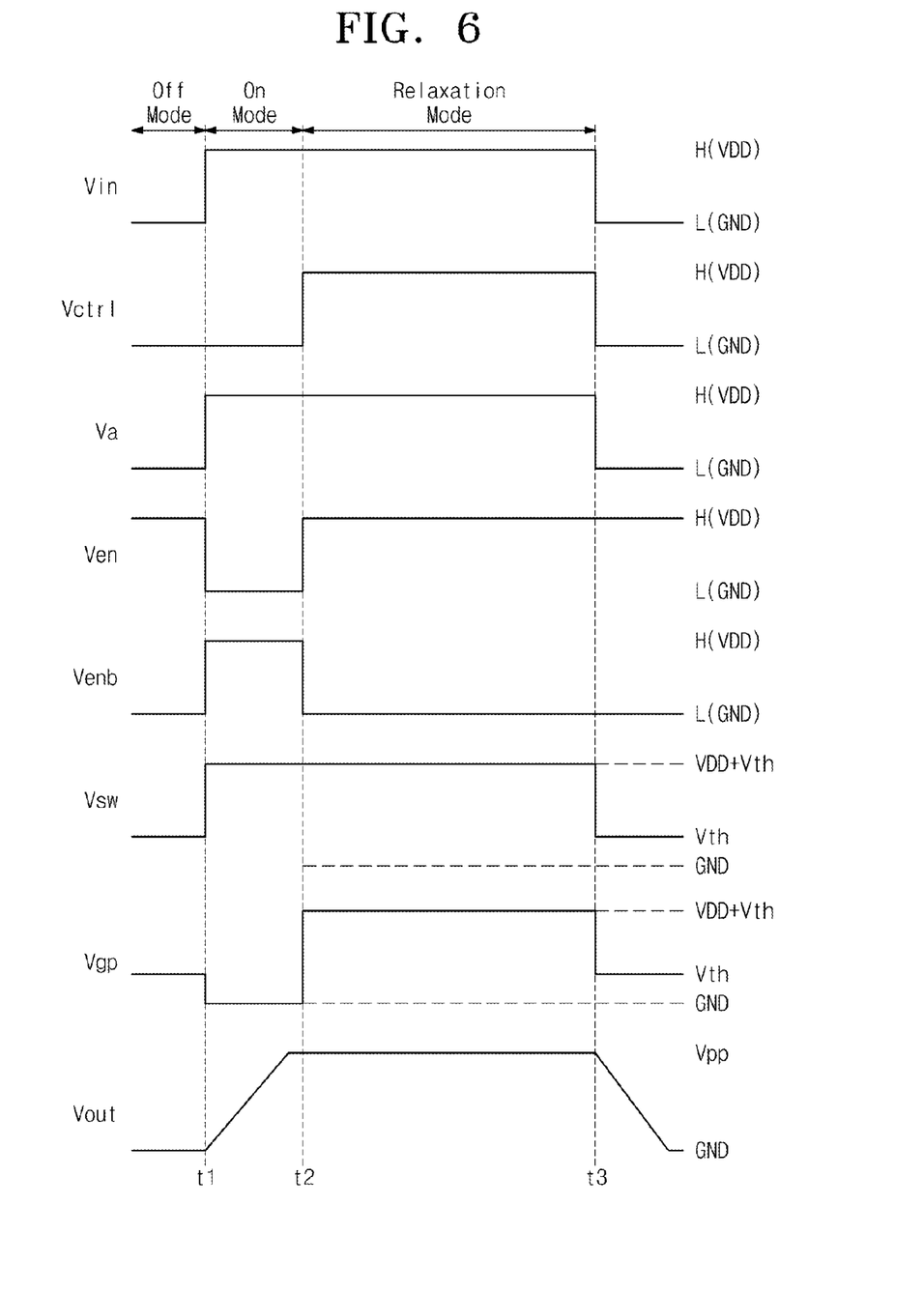
FIG. 6 is a timing diagram illustrating an operation of a high voltage switch of FIG. 3 according to an embodiment of the inventive concept.

FIG. 6 is a timing diagram illustrating an operation of a high voltage switch of FIG. 3 according to an embodiment of the inventive concept.

Referring to FIGS. 3 and 6, high voltage switch 124a may operate differently according to an off mode, an on mode, and a relaxation mode. First drive voltage VDD from an external source is provided as a power supply voltage of level shifter 124-1a, logic block 124-2a and inverter INV of FIG. 3. Thus, output voltage levels of level shifter 124-1a, logic block 124-2a and inverter INV is ground voltage GND and first drive voltage VDD. In a section before time t1, high voltage switch 124a may operate in the off mode. In an interval between time t1 and time t2, high voltage switch 124a may operate in the on mode. In an interval between time t2 and time t3, high voltage switch 124a may operate in the relaxation mode. In a section after time t3, high voltage switch 124a may operate in the off mode again.

In the off mode, input signal Vin and control signal Vctrl are input with a low level. Switching control signal Va is provided with the same low level as input signal Vin by logic block 124-2a. Enable signal Ven is generated with a high level by logic block 124-2a. Reverse enable signal Venb is generated with a low level by reversing enable signal Ven. Switching control signal Va is provided to a gate of second depletion mode transistor HVD2. Because switching control signal Va has a low level, switching voltage Vsw is provided as a threshold voltage Vth of second depletion mode transistor HVD2. Level shifter 124-1a receives switching voltage Vsw, enable signal Ven, and reverse enable signal Venb. Level shifter 124-1a provides PMOS gate voltage Vgp which is the same with switching voltage Vsw according to enable signal Ven and reverse enable signal Venb. PMOS gate voltage Vgp which is a threshold voltage Vth of second depletion mode transistor HVD2 is provided to a gate of PMOS transistor HVP. In the off mode, output signal Vout is set to ground voltage GND. Output signal Vout is provided to a gate of first depletion mode transistor HVD1. Thus, PMOS source voltage Vsp is generated as a threshold voltage Vth of first depletion mode transistor HVD1. Second depletion mode transistor HVD2 and first depletion mode transistor HVD1 may be manufactured with the same specification to have the same threshold voltage. Because a gate voltage and a source voltage of PMOS transistor HVP are the same, a leakage current flowing through PMOS transistor HVP can be cut off.

In the on mode, input signal Vin is input with a high level. Control signal Vctrl is input with a low level. Switching control signal Va is generated with the same high level as input signal Vin by logic block 124-2a. Enable signal Ven is generated with a low level by logic block 124-2a. Reverse enable signal Venb is generated with a high level by reversing enable signal Ven. Switching control signal Va is provided to a gate of second depletion mode transistor HVD2. Because switching control signal Va has a high level, switching voltage Vsw is provided as a sum of a voltage of switching control signal Va and a threshold voltage Vth of second depletion mode transistor HVD2. That is, switching voltage Vsw is provided as a sum (VDD+Vth) of first drive voltage VDD and a threshold voltage Vth of second depletion mode transistor HVD2. Level shifter 124-1a receives switching voltage Vsw, enable signal Ven, and reverse enable signal Venb. Level shifter 124-1a provides PMOS gate voltage Vgp which is ground voltage GND according to enable signal Ven and reverse enable signal Venb. PMOS transistor HVP is turned on. In the on mode, output signal Vout is increased to second drive voltage Vpp by a feedback structure of first depletion mode transistor HVD1 and PMOS transistor HVP.

In the relaxation mode, input signal Vin and control signal Vctrl are input with a high level. Switching control signal Va is generated with the same high level as input signal Vin by logic block 124-2a. Enable signal Ven is generated with a high level by logic block 124-2a. Reverse enable signal Venb is generated with a low level by reversing enable signal Ven. Switching control signal Va is provided to a gate of second depletion mode transistor HVD2. Because switching control signal Va has a high level, switching voltage Vsw is generated as a sum of a voltage of switching control signal Va and a threshold voltage Vth of second depletion mode transistor HVD2. That is, switching voltage Vsw is generated as a sum (VDD+Vth) of first drive voltage VDD and a threshold voltage Vth of second depletion mode transistor HVD2. Level shifter 124-1a receives switching voltage Vsw, enable signal Ven and reverse enable signal Venb. Level shifter 124-1a provides PMOS gate voltage Vgp which is the same with switching voltage Vsw according to enable signal Ven and reverse enable signal Venb. PMOS gate voltage Vgp which is the sum (VDD+Vth) of first drive voltage VDD and a threshold voltage Vth of second depletion mode transistor HVD2 is provided to a gate of PMOS transistor HVP. In the relaxation mode, output signal Vout is second drive voltage Vpp. PMOS source voltage Vsp is maintained to be second drive voltage Vpp. Thus, where PMOS gate voltage Vgp is increased from ground voltage GND to the sum (VDD+Vth) of first drive voltage VDD and a threshold voltage Vth of second depletion mode transistor HVD2, deterioration of PMOS transistor HVP can be prevented.

Time t2 at which the relaxation mode begins is determined using a level detector detecting a level of output signal Vout. The level detector can detect time that output signal Vout reaches second drive voltage Vpp. Thus, control signal Vctrl is generated according to a detection result. Time t2 at which the relaxation mode begins is determined as time after specific time passes after the on mode begins. Time that output signal Vout reaches second drive voltage Vpp is determined according to characteristics of devices in the high voltage switch. Time between time t1 and time t2 can be determined according to characteristics of devices in the high voltage switch. Thus, control signal Vctrl can be generated so that control signal Vctrl is increased to a high level at time t2 after predetermined time passes from time t1.

After time t3, high voltage switch 124a operates in the off mode. Input signal Vin and control signal Vctrl is input with a low level. Thus, PMOS transistor HVP is turned off by logic block 124-2a and level shifter 124-1a. Switching control signal Va is provided with the same low level as input signal Vin by logic block 124-2a. Switching control signal Va is provided to a source of NMOS transistor MN. Thus, output signal Vout can be lowered to ground voltage GND by NMOS transistor MN and third depletion mode transistor HVD3.

Figure 7:
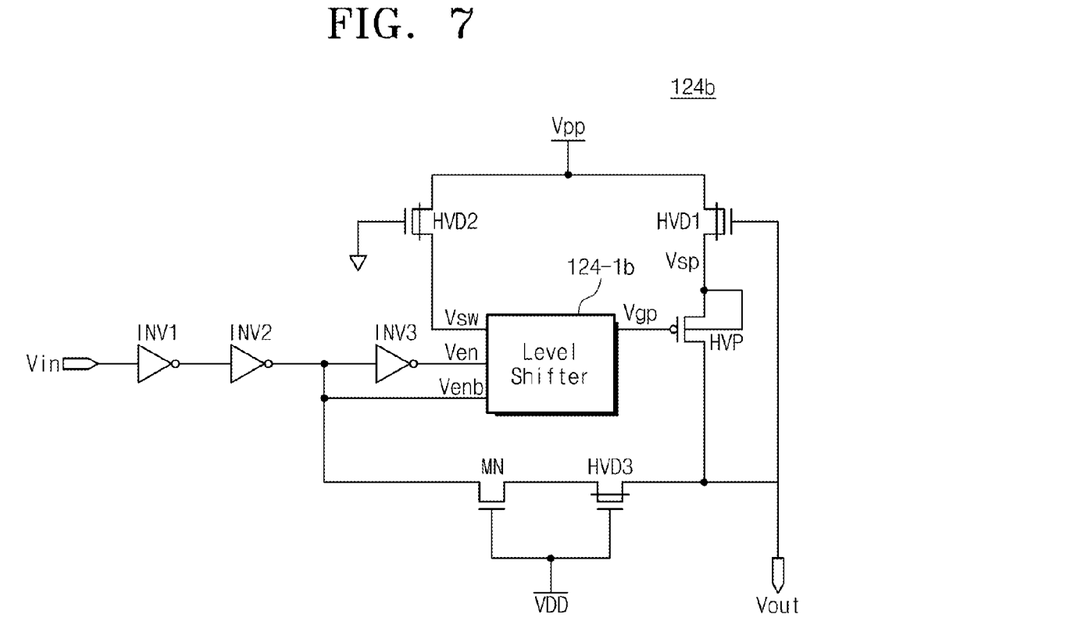
FIG. 7 is a circuit diagram illustrating a high voltage switch according to an embodiment of the inventive concept.

FIG. 7 is a circuit diagram illustrating a high voltage switch according to an embodiment of the inventive concept.

Referring to FIG. 7, a high voltage switch 124b may not include a logic block to share a first depletion mode transistor in multiple high voltage switches. High voltage switch 124b comprises a level shifter 124-1b, depletion mode transistors HVD1, HVD2, and HVD3, inverters INV1, INV2 and INV3, a PMOS transistor HVP and an NMOS transistor MN.

Level shifter 124-1b may receive a switching voltage Vsw, an enable signal Ven and a reverse enable signal Venb to provide a PMOS gate voltage Vgp. A drain of second depletion mode transistor HVD2 is connected to a terminal of a second drive voltage Vpp. A gate of second depletion mode transistor HVD2 is connected to a terminal of ground voltage GND. Thus, switching voltage Vsw is provided as a threshold voltage Vth of second depletion mode transistor HVD2. Enable signal Ven can be provided by reversing input signal Vin using inverters INV1, INV2 and INV3. Reverse enable signal Venb is generated with the same level as input signal Vin by inverters INV1 and INV2. Level shifter 124-1b may have the same structure as illustrated in FIG. 4.

When input signal Vin has a low level, high voltage switch 124b is turned off. When input signal Vin has a low level, high voltage switch 124b may operate in the same manner as the operation of the off mode section of high voltage switch 124a of FIG. 3. Thus, a detailed description is omitted. When input signal Vin has a low level, level shifter 124-1b may provide PMOS gate voltage Vgp which is the same with threshold voltage Vth of the second depletion mode transistor. A leakage current of PMOS transistor HVP is cut off.

Where input signal Vin has a high level, high voltage switch 124b is turned on. Where input signal Vin has a high level, high voltage switch 124b may operate in the same manner as the operation of the on mode section of high voltage switch 124a of FIG. 3. Thus, a detailed description is omitted. Where input signal Vin has a high level, level shifter 124-1b may provide PMOS gate voltage Vgp which is ground voltage GND. PMOS transistor HVP is turned on. High voltage switch 124b may provide an output signal increased to second drive voltage Vpp.

Figure 8:
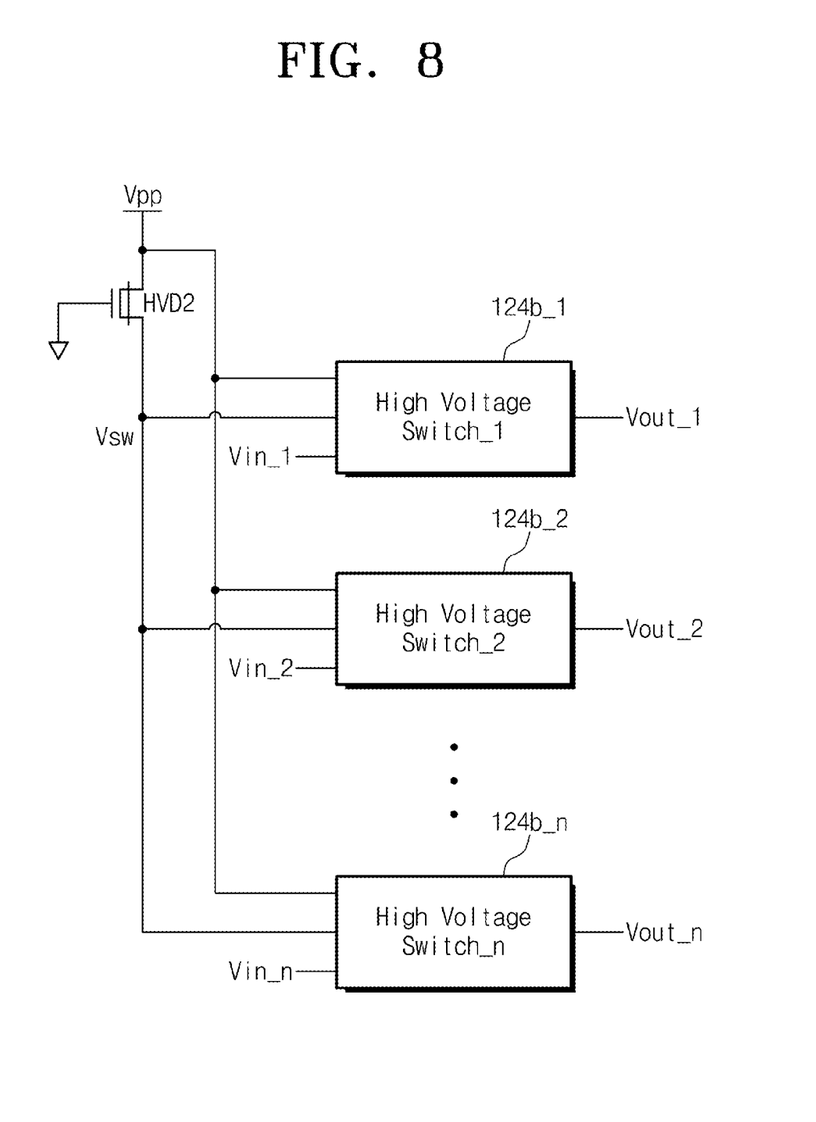
FIG. 8 is a circuit diagram illustrating multiple high voltage switches sharing a depletion mode transistor according to an embodiment of the inventive concept.

FIG. 8 is a circuit diagram illustrating multiple high voltage switches sharing a depletion mode transistor according to an embodiment of the inventive concept.

Referring to FIG. 8, multiple high voltage switches 124b_1~124b_n share a second depletion mode transistor HVD2. Each of high voltage switches 124b_1~124b_n may have the same structure as high voltage switch 124b of FIG. 7. Nonvolatile memory device 100 (See, e.g., FIG. 1) comprises a cell array 110 including multiple blocks. Nonvolatile memory device 100 comprises multiple high voltage switches 124b_1~124b_n corresponding to multiple blocks. Second depletion transistor HVD2 of FIG. 7 can be shared by high voltage switches 124b_1~124b_n. Thus, an area occupied by second depletion mode transistor HVD2 in high voltage switches 124b_1~124b_n is reduced.

A drain of second depletion mode transistor HVD2 is connected to a terminal of second drive voltage Vpp. Second drive voltage Vpp is provided to high voltage switches 124b_1~124b_n. A gate of second depletion mode transistor HVD2 is connected to a ground voltage (GND) terminal. A source of second depletion mode transistor HVD2 is connected to high voltage switches 124b_1~124b_n. High voltage switches 124b_1~124b_n share a switching voltage Vsw having a threshold voltage Vth of second depletion mode transistor HVD2. High voltage switches 124b_1~124b_n receive respective input signals Vin_1~Vin_n. High voltage switches 124b_1~124b_n provide output signals Vout_1~Vout_n to respective block pass transistors.

Figure 9:
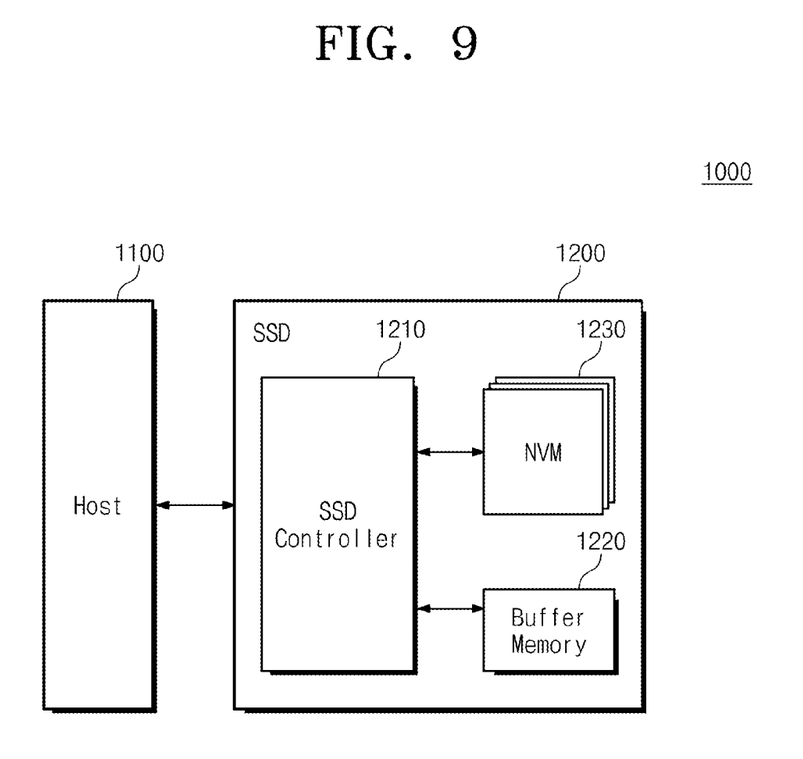
FIG. 9 is a block diagram illustrating a system comprising a solid state disk (SSD) according to an embodiment of the inventive concept.

FIG. 9 is a block diagram illustrating a user device including a solid state disk (SSD) in accordance with some other embodiments of the inventive concept. Referring to FIG. 9, a user device 1000 comprises a host 1100 and a SSD 1200. SSD 1200 comprises a SSD controller 1210, a buffer memory 1220 and a nonvolatile memory device 1230.

SSD controller 1210 may provide a physical connection between host 1100 and SSD 1200. That is, SSD controller 1210 may provide an interfacing with SSD 1200 in response to a bus format of host 1100. SSD controller 1210 decodes a command provided from host 1100. According to a decoded result, SSD controller 1210 accesses nonvolatile memory device 1230. Examples of a bus format of host 1100 comprises a universal serial bus (USB), a small computer system interface (SCSI), a PCI express, an ATA, a parallel ATA, a serial ATA, a serial attached SCSI, etc.

Buffer memory 1220 may temporarily store write data provided from host 1100 and data read from nonvolatile memory device 1230. Where data existing in nonvolatile memory device 1230 is cached when a read operation of host 1100 is requested, buffer memory 1220 can support a cache function of directly providing the cached data to host 1100. A data transmission speed by a bus format (e.g., SATA or SAS) of host 1100 is far faster than a transmission speed of a memory channel of SSD 1200. That is, where an interface speed of host 1100 is far fast, performance degradation caused by a difference in speed can be minimized by providing buffer memory 1220 of a high capacity.

Nonvolatile memory device 1230 is provided as a storage medium of SSD 1200. For example, nonvolatile memory device 1230 is provided by a NAND type flash memory having a high storage capacity. Nonvolatile memory device 1230 is constituted by multiple memory devices. In this case, each memory device is connected to the SSD controller by a channel unit.

Nonvolatile memory device 1230 comprises a high voltage switch in accordance with embodiments of the inventive concept. Thus, nonvolatile memory device 1230 can cut off a leakage current in a block in which an operation is not performed. Life of nonvolatile memory device 1230 can be extended by preventing deterioration of the PMOS transistor in the high voltage switch.

Nonvolatile memory device 1230 as a storage medium is described to be constituted by a NAND flash memory but nonvolatile memory device 1230 is constituted by other nonvolatile memory devices. For example, a PRAM, a MRAM, a ReRAM, a FRAM, a NOR flash memory, etc. is used as a storage medium. A memory system in which different types of memory devices are mixed may also be used as a storage medium. Nonvolatile memory device 1230 comprises a buffer area for a buffer program operation and a main area for a main program operation.

Figure 10:
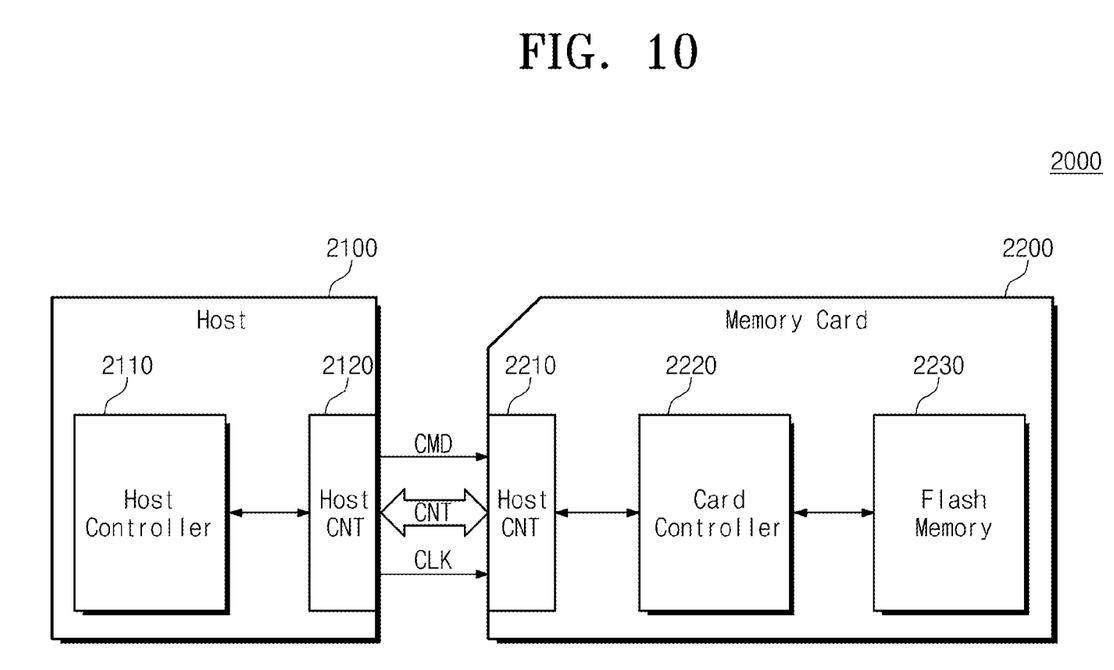
FIG. 10 is a block diagram illustrating a memory card according to an embodiment of the inventive concept.

FIG. 10 is a block diagram illustrating an example of a memory card in accordance with some other embodiments of the inventive concept. A memory card system 2000 comprises a host 2100 and a memory card 2200. Host 2100 comprises a host controller 2110 and a host connection unit 2120. Memory card 2200 comprises a card connection unit 2210, a card controller 2220 and a flash memory 2230.

Host connection unit 2120 and card connection unit 2210 is constituted by multiple pins. The pins comprise a command pin, a data pin, a clock pin, a power supply pin, etc. The number of pins is different depending on the type of memory card 2200. For example, a SD card may have 9 pins.

Host 2100 writes data in memory card 2200 or reads data stored in memory card 2200. Host controller 2110 transmits a command (e.g., a write command), a clock signal CLK generated from a clock generator (not shown) in host 2100 and data DATA to memory card 2200 through host connection unit 2120.

Card controller 2220 stores data in flash memory 2230 in synchronization with a clock signal CLK generated from a clock generator in card controller 2220 in response to a write command received through card connection unit 2210. Flash memory 2230 stores data transmitted from host 2100. Where host 2100 is a digital camera, flash memory 2230 stores image data.

Flash memory 2230 comprises memory cells being vertically stacked on a substrate. Flash memory 2230 comprises a high voltage switch as described above. Thus, flash memory 2230 can cut off a leakage current in a block in which an operation is not performed. Life of flash memory 2230 is extended by preventing deterioration of the PMOS transistor in the high voltage switch.

Card connection unit 2210 is configured to communicate with an external device (e.g., a host) through one of various interface protocols such as a USB, a MMC, a PCI-E, a SAS, a SATA, a PATA, a SCSI, an ESDI, and an IDE. The nonvolatile memory device and/or the memory controller can be mounted using various types of packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

Figure 11:
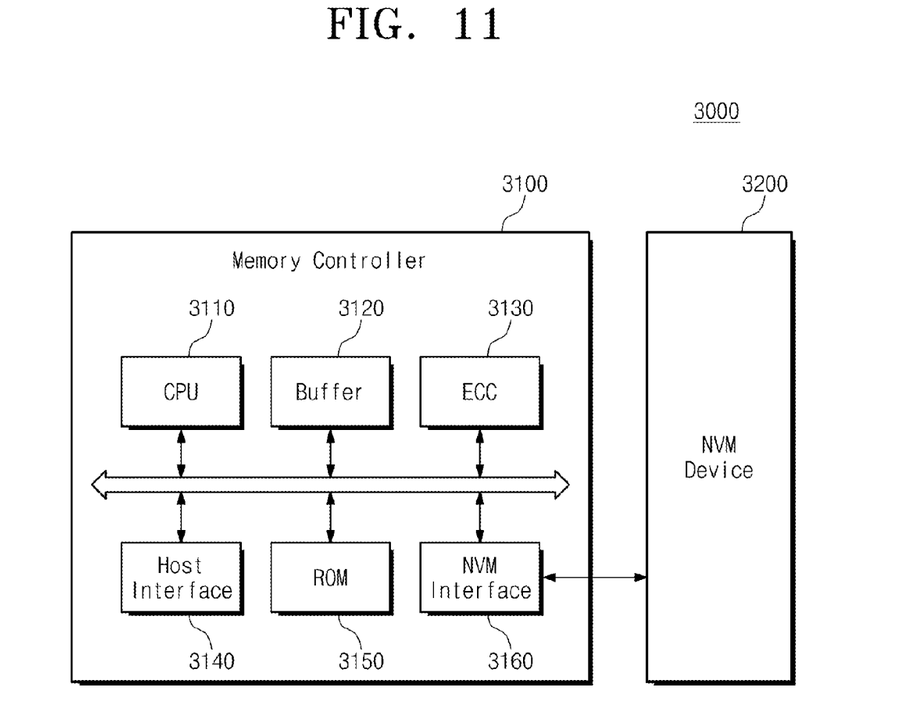
FIG. 11 is a block diagram illustrating a memory system according to an embodiment of the inventive concept.

FIG. 11 is a block diagram illustrating a memory system according to an embodiment of the inventive concept.

Referring to FIG. 11, memory system 3000 comprises a memory controller 3100 and a nonvolatile memory device 3200. Memory controller 3100 provides an interface between nonvolatile memory device 3200 and a host. Memory controller 3100 can be embodied to drive a firmware for controlling nonvolatile memory device 3200. Memory controller 3100 comprises a central processing unit (CPU) 3110, a buffer 3120, an error correction circuit 3130, a ROM 3150, a host interface 3140 and a memory interface 3160.

CPU 3110 controls operations of memory controller 3100. Buffer 3120 can be used as an operating memory of CPU 3110. When a write of the host is requested, data input from the host is temporarily stored in buffer 3120. When a read of the host is requested, data read from nonvolatile memory device 3200 is temporarily stored in buffer 3120.

Error correction circuit 3130 decodes data stored in buffer 3120 using an error correction code. At this time, the decoded data and the error correction code value is stored in nonvolatile memory device 3200. When a read operation is requested, error correction circuit 3130 can restore data read from nonvolatile memory device 3200 using the error correction code value. The error correction code value is included in the data which was read.

ROM 3150 may store data needed to drive memory controller 3100. Host interface 3140 comprises a protocol for performing a data exchange between the host and memory controller 3100. For example, memory controller 3100 is configured to communicate with the output (host) through one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol.

Memory interface 3160 can perform an interface function between nonvolatile memory device 3200 and memory controller 3100.

Nonvolatile memory device 3200 may comprise a high voltage switch as described above. Thus, nonvolatile memory device 3200 can cut off a leakage current in a block in which an operation is not performed. Life of nonvolatile memory device 3200 can be extended by preventing deterioration of the PMOS transistor in the high voltage switch.

As indicated by the foregoing, in certain embodiments of the inventive concept, a nonvolatile memory device comprises a high voltage switch that cuts off a leakage current by controlling a gate voltage of the PMOS transistor in the high voltage switch and prevents deterioration of the PMOS transistor in the high voltage switch.

The foregoing is illustrative of embodiments and is not to be construed as limiting thereof. Although a few embodiments have been described, those skilled in the art will readily appreciate that many modifications are possible in the embodiments without departing from the scope of the inventive concept as defined in the claims.

What is claimed is:

1. A high voltage switch operating in response to a first drive voltage and a second drive voltage higher than the first drive voltage, comprising:
a positive metal oxide semiconductor (PMOS) transistor transmitting the second drive voltage to an output terminal according to a voltage applied to a gate of the PMOS transistor;
a first depletion mode transistor providing the second drive voltage to the PMOS transistor according to an output signal fed back from the output terminal;
a second depletion mode transistor receiving the second drive voltage through one end and providing a switching voltage to another end according to a switching control signal; and
a level shifter connected to receive the switching voltage output from the second depletion mode transistor, the level shifter providing the switching voltage to the gate of the PMOS transistor according to an enable signal and an inverted enable signal,
wherein the enable signal has a ground voltage or a level of the first drive voltage responsive to an input signal and a control signal.

2. The high voltage switch of claim 1, wherein the first depletion mode transistor and the second depletion mode transistor have a same threshold voltage level.

3. The high voltage switch of claim 1, further comprising a logic block generating the enable signal to control the level shifter responsive to the input signal and the control signal.

4. The high voltage switch of claim 3, wherein the logic block transmits the switching control signal having a same level as the input signal to a gate of the second depletion mode transistor.

5. The high voltage switch of claim 1, wherein the level shifter provides the switching voltage or the ground voltage to the gate of the PMOS transistor according to the enable signal and the inverted enable signal.

6. The high voltage switch of claim 1, wherein where the enable signal has a high level and the inverted enable signal has a low level, the level shifter provides the switching voltage to the gate of the PMOS transistor.

7. The high voltage switch of claim 6, wherein where the input signal has a low level, the switching voltage has a same value as a threshold voltage of the second depletion mode transistor.

8. The high voltage switch of claim 6, wherein where the input signal has a high level, the switching voltage has a value which is a sum of a threshold voltage of the second depletion mode transistor and the first drive voltage.

9. The high voltage switch of claim 1, wherein where the enable signal has a low level and the inverted enable signal has a high level, the level shifter provides the ground voltage to the gate of the PMOS transistor.

10. The high voltage switch of claim 1, wherein where the input signal and the control signal have a low level, the level shifter provides a threshold voltage of the second depletion mode transistor to the gate of the PMOS transistor.

11. The high voltage switch of claim 1, wherein where the input signal has a high level and the control signal has a low level, the level shifter provides the ground voltage to the gate of the PMOS transistor.

12. The high voltage switch of claim 1, wherein where the input signal and the control signal have a high level, the level shifter provides a value that is a sum of a threshold voltage of the second depletion mode transistor and the first drive voltage to the gate of the PMOS transistor.

13. A nonvolatile memory device comprising:
a memory cell array comprising memory cells connected to a word line and a bit line;
a pass transistor transmitting a first high voltage to the word line; and
a high voltage switch boosting a level of an input signal to a level of a second high voltage to provide the boosted input signal to a gate of the pass transistor,
wherein the high voltage switch comprises:
a PMOS transistor transmitting the second high voltage to an output terminal according to a voltage applied to a gate of the PMOS transistor;
a first depletion mode transistor transmitting the second high voltage to the PMOS transistor according to an output signal fed back from the output terminal;
a second depletion mode transistor receiving the second high voltage through one end to provide a switching voltage to another end according to a switching control signal; and
a level shifter connected to receive the switching voltage output from the second depletion mode transistor, the level shifter providing the switching voltage to the gate of the PMOS transistor according to an enable signal and an inverted enable signal,
wherein the enable signal has a ground voltage or a level of a drive voltage responsive to an input signal and a control signal.

14. The nonvolatile memory device of claim 13, wherein the first depletion mode transistor and the second depletion mode transistor have a same threshold voltage level.

15. The nonvolatile memory device of claim 13, wherein the high voltage switch further comprises a logic block generating the enable signal for controlling the level shifter responsive to the input signal and the control signal.

16. A method of operating a non-volatile memory device comprising a high voltage switch that controls application of a high voltage signal to a memory array in response to a first drive signal and a second drive signal having a higher voltage level than the first drive signal, the method comprising:
operating a positive metal oxide semiconductor (PMOS) transistor to transmit the second drive voltage to an output terminal according to a voltage applied to a gate of the PMOS transistor;
operating a first depletion mode transistor to provide the second drive voltage to the PMOS transistor according to an output signal fed back from the output terminal;
operating a second depletion mode transistor to receive the second drive voltage through one end and to provide a switching voltage to another end according to a switching control signal; and
operating a level shifter to receive the switching voltage from the second depletion mode transistor, and to provide the switching voltage to the gate of the PMOS transistor according to an enable signal and an inverted a reverse enable signal,
wherein the enable signal has a ground voltage or a level of the first drive signal responsive to an input signal and a control signal.

17. The method of claim 16, wherein the first depletion mode transistor and the second depletion mode transistor have a same threshold voltage level.

18. The method of claim 16, further comprising operating a logic block to generate the enable signal to control the level shifter responsive to the input signal and the control signal.

19. The method of claim 18, wherein the logic block transmits the switching control signal having a same level as the input signal to a gate of the second depletion mode transistor.

20. The method of claim 16, wherein the level shifter provides the switching voltage or the ground voltage to the gate of the PMOS transistor responsive to the enable signal and the inverted enable signal.

* * * * *